United States Patent [19]

Kobayashi et al.

[11] Patent Number: 5,012,092
[45] Date of Patent: Apr. 30, 1991

[54] METHOD AND APPARATUS FOR FINE MOVEMENT OF SPECIMEN STAGE OF ELECTRON MICROSCOPE

[75] Inventors: Hiroyuki Kobayashi, Mito; Shigeru Izawa; Motohide Ukiana, both of Katsuta, all of Japan

[73] Assignee: Hitachi, Ltd., Tokyo, Japan

[21] Appl. No.: 456,522

[22] Filed: Dec. 26, 1989

[30] Foreign Application Priority Data

Dec. 27, 1988 [JP] Japan ................. 63-327783

[51] Int. Cl.$^5$ ............................................ H01J 37/26
[52] U.S. Cl. ................................ 250/311; 250/442.1
[58] Field of Search .............. 250/442.1, 310, 311, 250/491.1

[56] References Cited

U.S. PATENT DOCUMENTS

| | | | |
|---|---|---|---|
| 4,233,510 | 11/1980 | Sato | 250/306 |
| 4,393,309 | 7/1983 | Norioka | 250/310 |
| 4,687,931 | 8/1987 | Fukuhara et al. | 250/442.1 |
| 4,724,319 | 2/1988 | Shirota | 250/311 |
| 4,857,742 | 8/1989 | Kato et al. | 250/491.1 |

FOREIGN PATENT DOCUMENTS 55-46163 3/1980 Japan .

*Primary Examiner*—Bruce C. Anderson
*Attorney, Agent, or Firm*—Antonelli, Terry, Stout & Kraus

[57] ABSTRACT

Method and apparatus for fine movement of a specimen stage of an electron microscope wherein a value of enlargement magnification M of the electron microscope is set, a manipulation unit adapted to move an image enlarged by the electron microscope in X or Y direction is then manipulated; a pulse signal PX2 or PY2 which accords with a manipulation amount of the manipulation unit is delivered, the specimen stage is moved in the X or Y direction in accordance with the delivered pulse signal, a pulse signal PX1 and PY1 which accords with a moving distance of the specimen stage in the X or Y direction is delivered, and the operation of movement of the specimen stage is stopped when the relation represented by PX2·K/M=PX1 or the relation represented by PY2·K/M=PY1 stands, where K is a constant.

12 Claims, 3 Drawing Sheets

METHOD AND APPARATUS FOR FINE MOVEMENT OF SPECIMEN STAGE OF ELECTRON MICROSCOPE

BACKGROUND OF THE INVENTION

The present invention relates to method and apparatus for fine movement of a specimen stage of an electron microscope and more particularly to method and apparatus for fine movement of an electron microscope specimen stage in which the moving amount of the specimen stage is controlled in accordance with the enlargement magnification set for the electron microscope.

In conventional apparatus for specimen fine movement of the electron microscope, for the sake of moving a specimen, a drive handle of a drive mechanism having gears in combination is rotated by the operator so that the resulting torque is transmitted to a specimen stage through the drive mechanism to move the same.

With the conventional apparatus for specimen fine movement, the relation between the rotational amount of drive handle and the moving distance of specimen remains unchanged even when the enlargement magnification of the electron microscope changes and under the condition of the enlargement magnification being high, the moving amount of an enlarged image corresponding to the rotational amount of the drive handle becomes excessive, making it difficult to achieve, fine adjustments.

If the transmission ratio (gear ratio) of the drive mechanism is changed with a view of reducing the moving distance of the specimen corresponding to the rotational amount of the drive handle, the moving amount of an enlarged image corresponding to the rotational amount of the drive handle is unduly reduced under the condition of the enlargement magnification being low, raising a problem that to meet desirability for large movement of the enlarged image, the rotational amount of the drive handle must be increased unduly.

To solve the above problems, JP-A-55-46163 proposes an apparatus wherein the transmission ratio of the drive mechanism is changed in accordance with values of the enlargement magnification of the electron microscope to ensure that for individual different values of the enlargement magnification, the relation between the rotational amount of a motor corresponding to the aforementioned drive handle and the moving distance of an enlarged image on the phosphor screen can be substantially constant.

With the proposed apparatus which adjusts the relation between the rotational amount of motor and the moving distance of enlarged image by changing the transmission ratio of the drive mechanism, many gear ratio combinations are needed which comply with all steps, typically several of tens of steps for settable enlargement magnification, in order to accurately adjust the aforementioned relation for individual different values of the enlargement magnification, and realization of the gear ratio combinations is difficult from the standpoint of structural design of the mechanism. Therefore, the proposed apparatus can not succeed in keeping the relation between the rotational amount of motors and the moving distance accurately constant for individual values of the enlargement magnification.

In addition, the complicated drive mechanism will disadvantageously increase the size of the apparatus and degrade reliability.

According to another prior art disclosed in JP-B-52-701, due to the fact that in order to inspect the entire area of a specimen by moving the specimen in the X and Y directions while observing an enlarged image within the view field, it is necessary to move the specimen stage intermittently in such a manner that overlapping between the preceding view field and the succeeding view field is minimized as much as possible and the succeeding view field is prevented from going too far, the number of pulses (pulse number) supplied to a pulse motor to move the specimen stage by one stroke is controlled in accordance with individual values of magnification of the microscope.

According to still another prior art disclosed in JP-A-61-253756, the moving speed, V, of the specimen stage is controlled such that $V^* = M \cdot V = $ constant stands, thereby making it possible to keep the moving speed $V^*$ of an image constant even when the enlargement magnification M of the microscope changes.

SUMMARY OF THE INVENTION

An object of the present invention is to provide method and apparatus for fine movement of a specimen stage of an electron microscope which can move an enlarged image by a moving amount proportional to a manipulation amount (rotation angle) concomitant with manipulation for moving images, when a desired value of enlargement magnification is set in the electron microscope.

Another object of the invention is to provide method and apparatus for fine movement of a specimen stage of an electron microscope which can move, for a desired value of enlargement magnification set in the electron microscope, an enlarged image at and by a moving speed and a moving amount which are proportional to a manipulation speed and a manipulation amount which are concomitant with manipulation for moving images.

According to the invention, pulse numbers corresponding to a moving distance of the specimen stage are detected in the X and Y directions, and then the specimen stage is moved in the X and Y directions until the detected pulse numbers coincide with K/M (K: constant, M: enlargement magnification) of pulse numbers corresponding to manipulation amount of an image movement manipulation unit in the X and Y directions.

According to another embodiment of the invention, the specimen stage is moved by a distance proportional to K/M by immediately responding to operation of the image movement manipulation unit in the X and Y directions, so as to move an enlarged image at and by a moving speed and a moving amount which are proportional to a manipulation speed and a manipulation amount of the manipulation unit.

DESCRIPTION OF THE PREFERRED EMBODIMENTS

Figure 1:
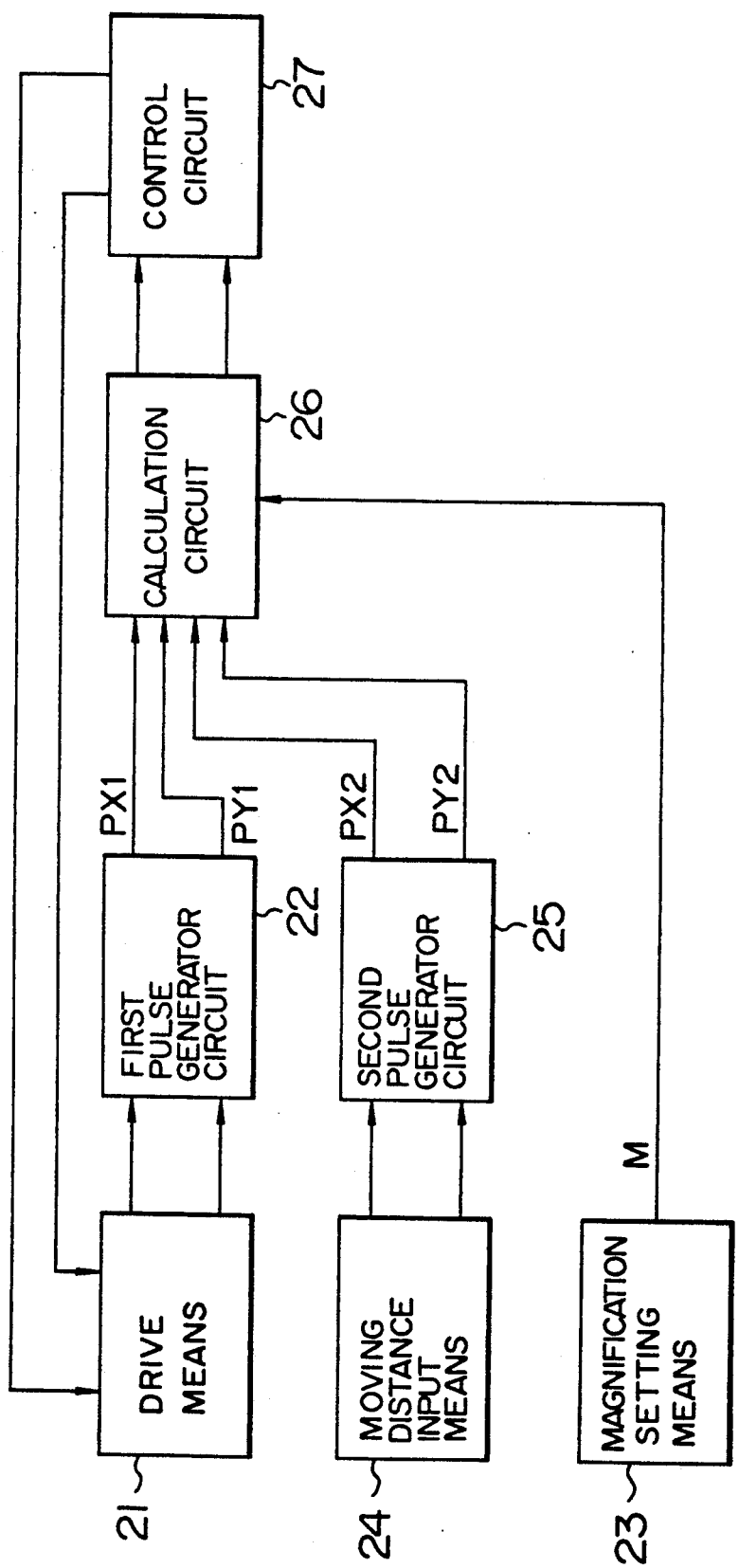
FIG. 1 is a block diagram showing the principle of the invention.

FIG. 1 is a block diagram showing the principle of the present invention.

Referring to FIG. 1, a drive means 21 for moving a specimen stage of an electron microscope in X and Y directions is connected to a first pulse generator circuit 22 and delivers thereto electrical signals or mechanical displacements indicative of a distance over which the specimen stage moves. The first generator circuit 22 is connected to a calculation circuit 26 and it converts the electrical signals or mechanical displacements into pulse signals PX1 and PY1 each having pulses which accord, in number, with a moving distance of the specimen stage and delivers these pulse signals to the calculation circuit 26.

A magnification setting means 23 for setting a value of enlargement magnification M of the electron microscope is connected to the calculation circuit 26 and delivers thereto a signal indicative of the enlargement magnification M.

An input means 24 for setting a distance over which an enlarged image moves is connected to a second pulse generator circuit 25 and delivers thereto electrical signals or mechanical displacements which correspond to a manipulation amount of the input means (i.e., an amount of manipulation for moving images effected by means of the input means). The second pulse generator circuit 25 is also connected to the calculation circuit 26 and it converts the electrical signals or mechanical displacements into pulse signals PX2 and PY2 each having pulses which accord, in number, with the set moving distance of the enlarged image.

The calculation circuit 26 calculates a signal PX2·K/M (K: constant) from the pulse signal PX2 and a signal PY2·K/M from the pulse signal PY2, compares magnitudes (integrals of pulses or pulse numbers) between the signals PX2·K/M and PX1 and magnitudes between the signals PY2·K/M and PY1 to provide difference signals and delivers these difference signals to a control circuit 27.

The control circuit 27 is connected to the drive means 21 and feedback controls the operation of the drive means 21 such that the magnitude of the signal PX2·K/M equals that of the signal PX1 and the magnitude of the signal PY2·K/M equals that of the signal PY1.

With the above construction, for a set moving distance of an enlarged image, the moving distance of the specimen stage decreases as the enlargement magnification M for the enlarged image increases and conversely the moving distance of the specimen stage increases as the enlargement magnification M for the enlarged image decreases.

Thus, for individual values of enlargement magnification of the electron microscope, the relation between the manipulation amount by operation knobs and the moving distance of the enlarged image can always keep constant and therefore the electron microscope can be improved considerably in its operational utility during observation of enlarged images.

Figure 2:
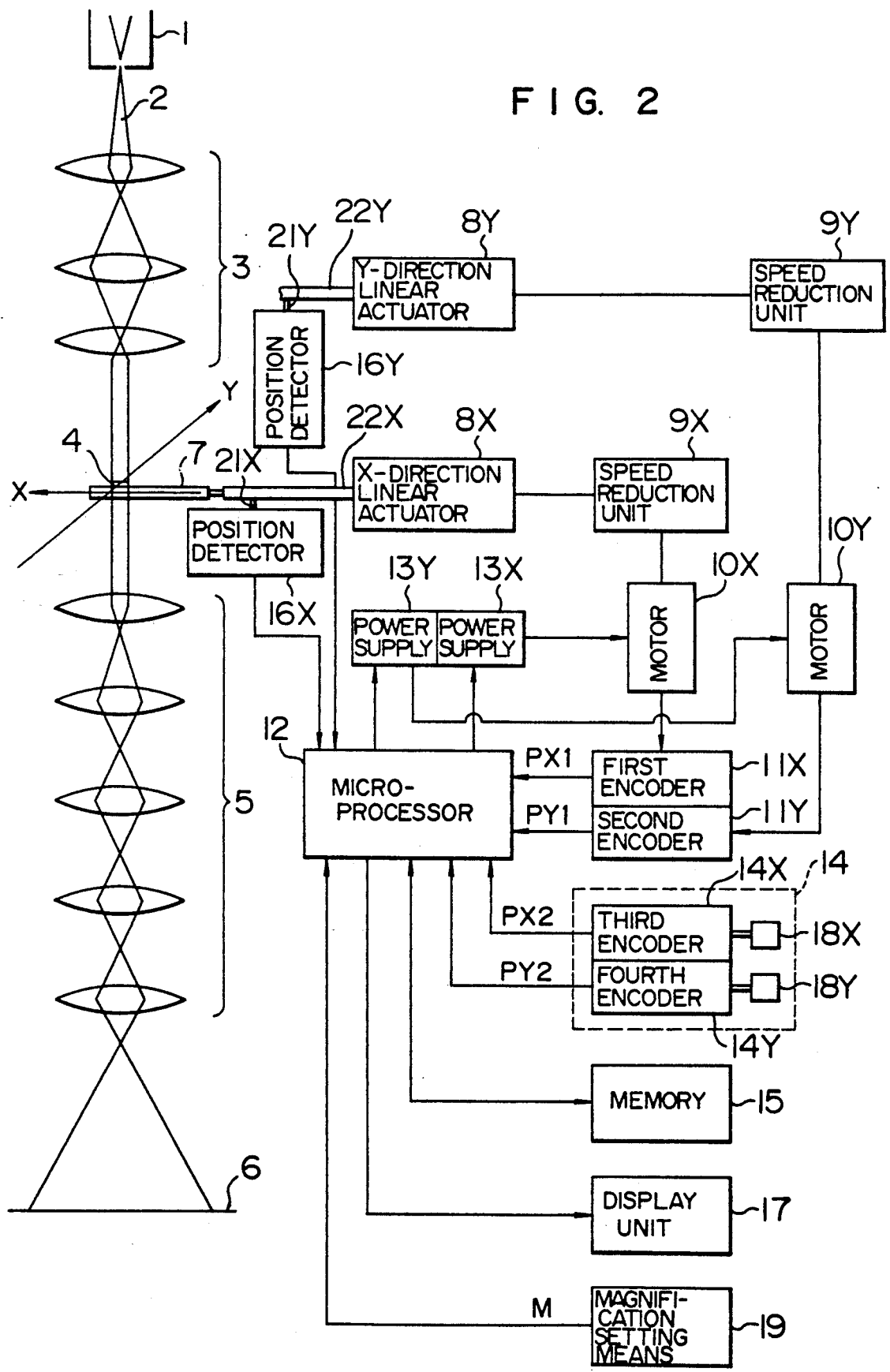
FIG. 2 is a block diagram showing an electron microscope according to an embodiment of the invention.

An embodiment of the invention will now be described with reference to FIG. 2.

A beam 2 of electrons emitted from an electron gun 1 is condensed and focused on a specimen 4 by means of an irradiation lens system 3. The electron beam 2 transmitting through the specimen 4 is enlarged by means of an image forming lens system 5 including an objective lens, thus forming an enlarged image of the specimen on a phosphor screen 6.

The specimen 4 is held on a stage 7 and for movement of the stage 7, in the X and Y directions, rotations of motors 10X and 10Y are respectively reduced by speed reduction units 9X and 9Y and the reduced rotational motions are converted into rectilinear motions by means of linear actuators 8X and 8Y which are connected to the stage 7.

The motor 10X is connected, on its common rotary shaft, with a first rotary encoder 11X and the motor 10Y is connected on its common rotary shaft with a second rotary encoder 11Y. A pulse signal PX1 has pulses which accord, in number, with a rotation number of the motor 10X delivered out of the rotary encoder 11X and a pulse signal PY1 has pulses which accord, in number, with a rotation number of the motor 10Y delivered out of the rotary encoder 11Y. The pulses of each of the pulse signals PX1 and PY1 are integrated by means of a microprocessor 12 to provide pulse numbers.

The microprocessor 12 controls and drives the motors 10X and 10Y through motor drive power supplies 13X and 13Y, respectively. An input unit 14 is adapted to enter an amount of movement of the specimen stage 7 and it includes rotary knobs 18X and 18Y operable to enter the amount of movement of the specimen stage and having shafts to which third and fourth rotary encoders 14X and 14Y are connected directly, so that a pulse signal PX2 having a pulse number proportional to a rotational amount of the rotary knob 18X or the third rotary encoder 14X and a pulse signal PY2 having a pulse number proportional to a rotational amount of the rotary knob 18Y or the fourth rotary encoder 14Y are delivered from the input unit 14 to the microprocessor 12.

Programs and data necessary to control the microprocessor 12 are stored in a memory 15. A magnification setting means 19 is adapted to set a value of enlargement magnification M of the electron microscope. Position detectors 16X and 16Y are adapted to detect a reference point of the specimen stage and will be detailed later.

The operation of the electron microscope constructed as above will now be described in greater detail.

When the operator designates a value of enlargement magnification M of the electron microscope by manipulating the magnification setting means 19, the microprocessor 12 operates to send a control signal to a control means, conventionally known and not shown herein, of the lens system 5 and the control means adjusts the exciting current to the lens system 5 so as to set the designated value of enlargement magnification.

Under this condition, when the operator manipulates the rotary knobs 18X and 18Y by rotating them in order to change the observation position of an enlarged image, the third and fourth encoders 14X and 14Y connected directly to the rotary knobs 18X and 18Y deliver to the microprocessor 12 pulse signals PX2 and PY2 having pulse numbers which accord with mechanical (angular) displacements resulting from the rotation manipulation.

The enlargement magnification M of the electron microscope has already been registered in the microprocessor 12. Therefore the microprocessor 12 operates to multiply the pulse numbers of the pulse signals PX2 and PY2, delivered out of the third and fourth encoders 14X and 14Y, by K/M (K is a constant) to provide signals PX2·K/M and PY2·K/M which are stored as calculated pulse numbers in the microprocessor 12.

The constant K is of a predetermined value which is specified to individual electron microscopes. For example, if one pulse from each of the third and fourth encoders 14X and 14Y is so set as to correspond to one pulse from each of the first and second encoders 11X and 11Y under the condition of the enlargement magnification being 10,000, the constant K is set to 10,000.

With the electron microscope having the constant K being 10,000, when the enlargement magnification is set to, for example, 1,000,000 and the pulse numbers delivered out of the encoders 14X and 14Y are 1000 and 500, respectively, the calculated pulse numbers PX2·K/M and PY2·K/M are 10 and 5, respectively.

On the other hand, pulse numbers of pulse signals PX1 and PY1 which accord with rotation numbers of the motors 10X and 10Y, that is, actual moving distances in the X and Y directions of the specimen stage are also delivered from the encoders 11X and 11Y to the microprocessor 12.

The microprocessor 12 compares the calculated pulse number PX2·K/M with the pulse number of the pulse signal PX1 and the calculated pulse number PY2·K/M with the pulse number of the pulse signal PY1 to provide difference signals {(PX2·K/M)−PX1} and {(PY2·K/M)−PY1} and delivers to the power supplies 13X and 13Y control signals which cause the power supplies to operate so as to make the two difference signals zero.

The power supplies 13X and 13Y then deliver drive signals to the motors 10X and 10Y which in turn cause the linear actuators 8X and 8Y to advance or retreat.

In this manner, for the enlargement magnification being 1,000,000, 100 pulses from each of the encoders 14X and 14Y correspond to one pulse from each of the encoders 11X and 11Y. Therefore, the moving amount of the specimen stage 7 corresponding to the rotation numbers (rotation angles) of the rotary knobs 18X and 18Y can be 1/100 of that obtained for the enlargement magnification being 10,000.

Accordingly, for individual values of enlargement magnification of the electron microscope, the relation between the rotation number of each of the rotary knobs 18X and 18Y and the moving amount of the enlarged image can always be kept constant and therefore the electron microscope can be improved considerably in its operational utility during observation of enlarged images.

Each of the first to fourth rotary encoders 11X, 11Y, 14X and 14Y has a disc formed with two series of slots which are out of phase from each other by an electrical angle of 90° and photo-couplers provided in association with respective slots of each series. Accordingly, each encoder delivers two pulse signals which are 90° out of phase from each other. The polarity of the phase difference between the two pulse signals is inverted in accordance with the direction of rotation of the rotary encoder and therefore the forward and backward rotations can be distinguished from each other. Ordinary rotary encoders are constructed as described above.

Accordingly, the phase difference pulse signal indicative of forward or backward rotation is also delivered out of each of the third and fourth encoders 14X and 14Y and then the microprocessor 12 responsive to the phase difference pulse signal controls the direction of rotation of each motor 10X or 10Y.

If, through the feedback control wherein the motors 10X and 10Y are controlled such that the pulse numbers of the pulse signals PX1 and PY1 from the first and second encoders 11X and 11Y equal the calculated pulse numbers, the motors 10X and 10Y are rotated excessively by a surplus pulse number owing to their inertia, then the motors will be so controlled as to be rotated in the backward direction until pulses indicative of backward rotation are integrated to that surplus pulse number.

The position detectors 16X and 16Y are adapted to detect a reference point of the specimen stage 7 and each position detector includes a sensor such as a photoelectric switch and a control circuit for the sensor.

The position detectors 16X and 16Y are preferably used to promote rapid recognition of an observation position of an enlarged image by displaying on the display unit 17 but the provision of the position detectors is not related directly to attainment of the objects of the present invention. Advantageously, the position detectors 16X and 16Y are effective to avoid movement of the specimen outside of the view field, to avoid repetitive observation of the same portion, once observed, of the specimen and to insure rapid movement of a portion desired to be observed to within the view field, thereby considerably improving the electron microscope in its operational utility.

The position detector 16X or 16Y detects that a projection 21X or 21Y secured to the bottom of a drive arm 22X or 22Y of the linear actuator 8X or 8Y adapted to move the specimen stage 7 in the X or Y direction reaches a reference position. More particularly, the position detector 16X or 16Y detects that the projection 21X or 21Y covers the photoelectric switch and intercepts light therefrom when the specimen stage is positioned at the center of its movable area, and delivers a detection signal to the microprocessor 12. Responsive to the detection signals, the microprocessor processor 12 operates to reset a counter for counting the pulse number of the pulse signal PX1 delivered out of the first encoder 11X and a counter for counting the pulse number of the pulse signal PY1 delivered out of the second encoder 11Y.

Figure 3:
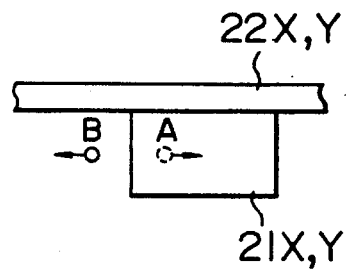
FIG. 3 is a fragmentary diagram for explaining the operation of an embodiment of the essential part of the invention.

In order to accurately display the position of the specimen stage, it is necessary to indicate the position of the specimen stage in terms of a displacement from the reference position. To this end, when the power supply of the electron microscope is turned on, the specimen stage has to be moved temporarily to the reference position so that count values of the counters representative of a displacement of the specimen stage may be reset to zero. For realization of this procedure, a decision is needed as to which direction the reference position lies in with respect to the specimen stage and movement of the specimen stage to the reference position is needed. To meet these requirements, the projection 21X or 21Y secured to the bottom of the drive arm 22X or 22Y of the linear actuator 8X or 8Y is designed to take the form of a light shielding plate 21X or 21Y having a wide area as shown in FIG. 3, to make it possible to position the specimen stage 7 at the reference position when the left end edge of the light shielding plate 21X or 21Y coincides with the position of luminous flux from the photo-coupler. For example, when the position of luminous flux from the photo-coupler of the position detector 16X or 16Y is at A in FIG. 3 as viewed from the light shielding plate 21X or 21Y, the light is intercepted by the light shielding plate 21X or 21Y and at that time the microprocessor operates to control drive of the motor 10X or 10Y such that the drive arm 22X or 22Y is moved to the right. Conversely, when the position of luminous flux from the photo-coupler is at B in FIG. 3 as viewed from the light shielding plate 21X or 21Y, the light is not intercepted by the light shielding plate 21X or 21Y and at that time the drive arm is moved to the left. In this manner, the light shielding plate 21X or 21Y is moved in a direction in which its left end edge approaches the position of luminous flux and when the output of the photo-coupler is inverted, it is detected that the specimen stage reaches the reference position in the X or Y direction.

Thus, in accordance with the present embodiment, when the power supply of the electron microscope is turned on, the microprocessor 12 operates to move the specimen stage in the X and Y directions, registers as the reference position the position at which the specimen stage 7 is positioned when the detection signal is received, and registers as relative positions to the reference point the positions which the specimen stage 7 takes subsequently.

Since the relative position is delivered to the display unit 17, the operator can easily recognize the position of the specimen stage 7 by watching the display unit 17.

In this manner, the observation position of an enlarged image can always be represented by a relative position to the reference point and therefore by recording the relative position, the position for the previous observation can be found out when the subsequent observation is carried out.

In the foregoing embodiment, the moving amount of the specimen stage 7 is described as determined from the rotational amounts of the motors 10X and 10Y, but the invention is not limited thereto and the moving amount of advance/retreat motion of the linear actuator or the specimen stage may be detected by means of a suitable means such as an encoder.

Further, in the foregoing embodiment, the mechanical displacement of the rotary knob is inputted as the moving distance of an enlarged image and converted into a pulse signal by means of the rotary encoder connected directly to the shaft of the rotary knob but in an alternative, a pulse output circuit may be provided which delivers a predetermined pulse signal only while a switch means remains closed and a closure time of the switch means may be inputted as a moving distance of an enlarged image.

Figure 4:
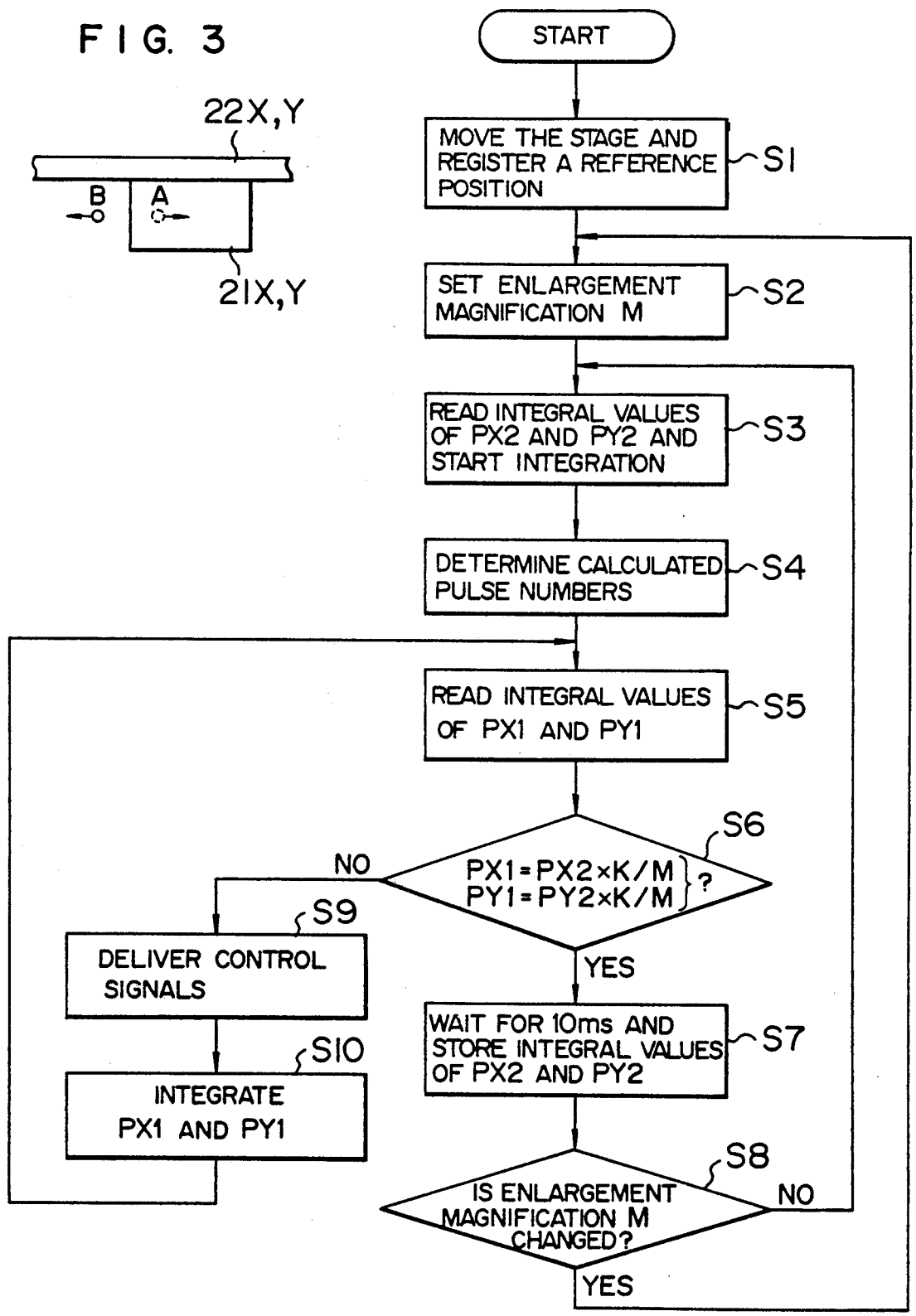
FIG. 4 is a flow chart showing a method of controlling the apparatus for fine movement of specimen stage according to the invention.

FIG. 4 is a flow chart showing a method of controlling the apparatus for fine movement of specimen stage according to the invention.

When the power supply of the electron microscope is turned on, step S1 is executed in which the microprocessor 12 operates to move the specimen stage in the X and Y directions until the specimen stage is positioned at a position where a detection signal indicative of the reference position is generated and register the position of the specimen stage 7 at that time as the reference position.

In step S2, the operator sets a value of enlargement magnification M of the electron microscope.

In step S3, pulses of the pulse signal PX2 delivered out of the third encoder 14X and pulses of the pulse signal PY2 delivered out of the fourth encoder 14Y are integrated by means of the microprocessor 12, the integral values are read, and integration is restarted, beginning with zero, in synchronization with start of a timer.

In step S4, the integral values of the pulse signals PX2 and PY2 are multiplied by constant K and divided by enlargement magnification M to provide calculated pulse numbers PX2·K/M and PY2·K/M.

In step S5, pulses of the pulse signal PX1 delivered out of the first encoder 11X and pulses of the pulse signal PY1 delivered out of the second encoder 11Y are integrated by means of the microprocessor 12 and the integral values are read.

In step S6, the calculated pulse number (integral value) PX2·K/M is compared with the pulse number (integral value) of the pulse signal PX1 and the calculated pulse number (integral value) PY2·K/M is compared with the pulse number (integral value) of the pulse signal PY1 to check equality therebetween.

In the initial state where the rotary knobs 18X and 18Y are not rotated, that is, where any moving amount of an enlarged image is not inputted by the operator, the calculated pulse numbers PX2·K/M and PY2·K/M as well as the pulse numbers of the pulse signals PX1 and PY1 are zero and the microprocessor 12 therefore determines the aforementioned equality and the procedure proceeds to step S7.

In the first cycle of looping following turn-on of the power supply, the integral values read out in the steps S3 and S5 are zero and consequently the procedure also proceeds to the step S7.

In the step S7, the pulse numbers (integral values) of the pulse signals PX2 and PY2 are stored or registered at the expiration of 10 msec as measured by the timer started in the step S3. This permits counting pulse numbers of the pulse signals PX2 and PY2 proportional to amounts of manipulation of the rotary knobs 18X and 18Y effected to move an enlarged image during the predetermined 10 msec. interval of time, and therefore the resulting count values are proportional to the manipulation speeds of the rotary knobs.

In step S8, it is decided whether the enlargement magnification M is changed and if changed, the procedure proceeds to the step S2 but if not changed, the procedure proceeds to the step S3.

When the operator inputs a moving amount of an enlarged image by manipulating the rotary knobs 18X and 18Y, the pulse signals PX2 and PY2 having pulse numbers corresponding to manipulation amounts of the rotary knobs 18X and 18Y are delivered out of the encoders 14X and 14Y, and the pulse numbers are counted, stored in the step S7 and read out in the step S3 by means of the microprocessor 12. In the step S5, because the motors 10X and 10Y are not started to rotate yet, PX1=0 and PY1=0 are read as in the previous cycle.

In the step S6, the calculated pulse number (integral value) PX2·K/M is compared with the pulse number (integral value) of the pulse signal PX1 and the calculated pulse number PY2·K/M is compared with the pulse number of the pulse signal PY1, and in this cycle, there result $PX2·K/M > PX1$ and $PY2·K/M > PY1$ and the procedure proceeds to step S9.

In the step S9, optimum rotation numbers of the motors 10X and 10Y for setting up $PX2·K/M = PX1$ and $PY2·K/M = PX1$ are determined on the basis of the difference between PX2·K/M and PX1 and the difference between PY2·K/M and PX1, and control signals in accordance with the thus determined optimum rotation numbers are delivered to the power supplies 13X and 13Y.

In step S10, pulses of the pulse signals PX1 and PY1 needed for the specimen stage drive motors 10X and 10Y are integrated in accordance with the control signals obtained in the step S9 and the resulting integral values are read out in the step S5. The above operation repeats itself until "YES" is issued from the step S6.

As described above, according to the invention, for individual values of enlargement magnification of the electron microscope, the manipulation speeds and the rotational amounts of the rotary knobs adapted to set the moving distance of an enlarged image always correspond to the moving speed and the moving distance of the enlarged image in constant relationship and therefore the electron microscope can be improved considerably in its operational utility during observation of enlarged images.

We claim:

1. An apparatus for fine movement of a specimen stage of an electron microscope, comprising:
   an electron beam optical system for irradiating a specimen mounted on said specimen stage with an electron beam and forming on a viewing screen a magnified image of said specimen;
   a drive unit for moving said specimen stage in X and perpendicular Y directions on a plane substantially perpendicular to the optical axis of said electron beam optical system;
   means for setting a value of enlargement magnification, M, of said electron beam microscope;
   a first pulse generator circuit for generating a pulse signal PX1 which accords, in number of pulses, with the distance said specimen stage moves in said X direction, and a pulse signal PY1 which accords, in number of pulses, with the distance said specimen stage moves in said Y direction;
   input means for instructing movement of said specimen stage and therefore the magnified image of said specimen as viewed on said viewing screen by a desired distance in at least one of said X and Y directions;
   a second pulse generator circuit for generating a pulse signal PX2 which accords, in number of pulses, with said instructed movement in the X direction by said input means, and a pulse signal PY2 which accords, in number of pulses, with said instructed movement in the Y direction by said input means; and
   drive control means for sending control signals to said drive unit after said input means instructs movement of said specimen stage by said drive unit until the following equations are satisfied:
   $PX2 \cdot K/M = PX1$
   $PY2 \cdot K/M = PY1$
   where K is a constant.

2. The apparatus according to claim 1 wherein said drive unit includes a set of motors for driving said specimen stage in said X and Y directions, and a set of linear actuators for converting rotational motion of said set of motors into rectilinear motion in said X and Y directions.

3. The apparatus according to claim 2 wherein said first pulse generator circuit includes a set of rotary encoders connected respectively to rotary shafts of said set of motors.

4. The apparatus according to claim 2 wherein said first pulse generator circuit includes means for detecting rectilinear motion of said set of linear actuators and delivering pulse signals which accord, in number of pulses, with the rectilinear distance of movement provided by said set of linear actuators.

5. The apparatus according to claim 1 wherein said input means includes a set of rotary knobs for instructing movements of said specimen stage in said X and Y directions.

6. The apparatus according to claim 5 wherein said second pulse generator circuit includes a set of rotary encoders connected respectively to rotary shafts of said set of motors.

7. The apparatus according to claim 1 further comprising:
   means for detecting a reference position of said specimen stage;
   means for detecting the amount of movement of said specimen stage from said reference position on the basis of said pulse signals PX1 and PY1 delivered out of said first pulse generator circuit; and
   means for displaying the distances detected by amount of movement detecting means.

8. The apparatus according to claim 7 wherein said amount of movement detecting means includes means for counting pulses delivered out of said first pulse generator circuit.

9. The apparatus according to claim 8 further comprising:
   means for moving said specimen stage to said reference position and stopping movement of said specimen stage at said reference position when said means for detecting a reference position detects said reference position; and
   means for resetting said counting means when said means for detecting a reference position detects said reference position.

10. A method for fine movement of a specimen stage of an electron microscope, comprising the steps of:
    setting a value of enlargement magnification, M, of said electron microscope;
    forming on a viewing screen an enlarged image, magnified M times, of a specimen mounted on said specimen stage;
    operating a manipulation unit means that instructs movement of said specimen stage and therefore said enlarged image as viewed on said viewing screen, instructed movement of said specimen stage is in at least the X direction or the perpendicular Y direction on a plane substantially perpendicular to the optical axis of the optical axis of said electron microscope;
    delivering at least a pulse signal PX2 or a pulse signal PY2 which accords with the amount of movement instructed to be caused by said manipulation unit means, respectively, in said X direction and said Y direction;
    moving said specimen stage in at least said X or Y directions in accordance with said pulse signal PX2 and said pulse signal PY2;
    delivering at least a pulse signal PX1 or a pulse signal PY1 which accords with the distance said specimen stage moves in said X or Y directions, respectively; and
    stopping movement of said specimen stage when the relation represented by $PX2 \cdot K/M = PX1$ and the relation represented by $PY2 \cdot K/M = PY1$ are satisfied, where K is a constant.

11. A method for fine movement of a specimen stage of an electron microscope, comprising the steps of:

setting a value of enlargement magnification, M, of said electron microscope;
forming on a viewing screen an enlarged image, magnified M times, of a specimen mounted on said specimen stage;
operating a manipulation unit means that instructs movement of said specimen stage so said enlarged image as viewed on said viewing screen, instructed movement of said specimen stage is in at least the X direction or the perpendicular Y direction on a plane substantially perpendicular to the optical axis of said electron microscope;
delivering, within a predetermined interval of time, at least a pulse signal PX2 or a pulse signal PY2 which accords with the amount of movement instructed to be caused by said manipulation unit means, respectively, in said X direction and said Y direction;
moving said specimen stage in at lease said X or Y direction in accordance with said pulse signal PX2 and said pulse signal PY2;
delivering at least a pulse signal PX1 or a pulse signal PY1 which accords with the distance said specimen stage moves in said X or Y directions, respectively;
continuing movement of said specimen stage until the relation represented by $PX2 \cdot K/M = PX1$ and the relation represented by $PY2 \cdot K/M = PY1$ are satisfied, where K is a constant; and operating said manipulation unit means repetitively.

12. A method for fine movement of a specimen stage of an electron microscope, comprising the steps of:
moving said specimen stage to a reference position;
setting a value of enlargement magnification, M, of said electron microscope;
forming on a viewing screen an enlarged image, magnified M times, of a specimen mounted on said specimen stage;
operating a manipulation unit means that instructs movement of said specimen stage so said enlarged image as viewed on said viewing screen, instructed movement of said specimen stage is in at least the X direction or the perpendicular Y direction on a plane substantially perpendicular to the optical axis of said electron microscope;
detecting outputs from said manipulation unit means;
moving said specimen stage in at least the X or Y directions in accordance with said detected outputs of said manipulation unit means;
detecting and displaying distance moved from said reference position of said specimen stage;
delivering at least a pulse signal PX1 or a pulse signal PY1 which accords with the distance said specimen stage has moved in said X or Y directions, respectively; and
operating said specimen stage moving step until the relations represented by $PX2 \cdot K/M = PX1$ and the relation represented by $PX2 \cdot K/M = PY1$ are satisfied, where K is a constant.

* * * * *